United States Patent [19]

Sawazaki

[11] 4,217,149

[45] Aug. 12, 1980

[54] METHOD OF MANUFACTURING COMPLEMENTARY INSULATED GATE FIELD EFFECT SEMICONDUCTOR DEVICE BY MULTIPLE IMPLANTATIONS AND DIFFUSION

[75] Inventor: Tamaki Sawazaki, Gunma, Japan

[73] Assignees: Sanyo Electric Co., Ltd., Moriguchi; Tokyo Sanyo Electric Co., Ltd., Gunma, both of Japan

[21] Appl. No.: 14,922

[22] Filed: Feb. 26, 1979

Related U.S. Application Data

[62] Division of Ser. No. 828,852, Aug. 29, 1977, abandoned.

[30] Foreign Application Priority Data

Sep. 8, 1976 [JP] Japan ................... 51-108602

[51] Int. Cl.² .............. H01L 21/263; H01L 7/54; H01L 21/225

[52] U.S. Cl. ................... 148/1.5; 148/187; 357/23; 357/44; 357/91

[58] Field of Search ............ 148/1.5, 187; 357/91, 357/23, 44

[56] References Cited

U.S. PATENT DOCUMENTS

| | | | |
|---|---|---|---|
| 3,806,371 | 4/1974 | Barone | 148/1.5 |
| 4,013,484 | 3/1977 | Boleky et al. | 148/1.5 |
| 4,016,594 | 4/1977 | Shappir | 357/41 |
| 4,033,797 | 7/1977 | Dill et al. | 148/187 |
| 4,035,207 | 7/1977 | Meusburger et al. | 156/628 |
| 4,045,250 | 8/1977 | Dingwall | 148/1.5 |
| 4,046,606 | 9/1977 | Lambert | 148/187 |
| 4,074,301 | 2/1978 | Paivinen et al. | 357/23 |
| 4,104,784 | 8/1978 | Klein | 29/571 |
| 4,108,686 | 8/1978 | Jacobus, Jr. | 148/1.5 |
| 4,139,402 | 2/1979 | Steinmaier et al. | 148/188 |
| 4,151,635 | 5/1979 | Kashkogli et al. | 29/571 |

Primary Examiner—R. Dean
Assistant Examiner—Upendra Roy
Attorney, Agent, or Firm—W. G. Fasse; D. F. Gould

[57] ABSTRACT

A semiconductor substrate of an N type is formed partially of a well region of a P type by means of a first ion implantation process, then subjected to selective diffusion to form source and drain regions of a P type on the surface of the original substrate, whereby a first insulated gate field effect transistor is formed, and further subjected to selective diffusion to form source and drain region of an N type in the well, whereby a second insulated gate field effect transistor is formed. The semiconductor device is then subjected to a second ion implantation process such that an impurity of an N type is simultaneously ion implanted in the substrate surface surrounding at least the first field effect transistor and the channel region of the second field effect transistor, and is then subjected to formation of an insulation film such that a thick insulation film is formed on the surface of the original substrate and the well, while a thin gate insulation film is formed on the channel regions of the first and second field effect transistors. Then the device is further subjected to a third ion implantation process such that an impurity of a P type is ion planted to the channel regions of the first and second field effect transistors through the thin gate insulation films.

6 Claims, 11 Drawing Figures

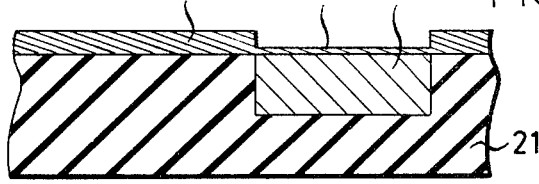
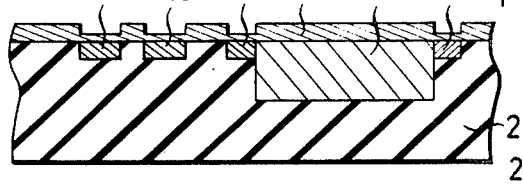
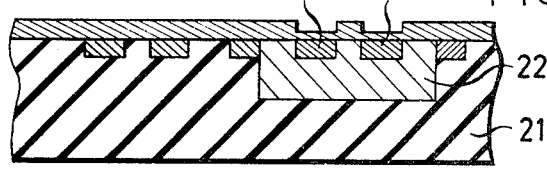
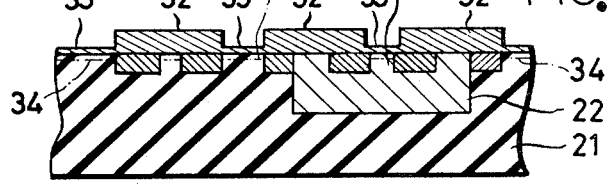
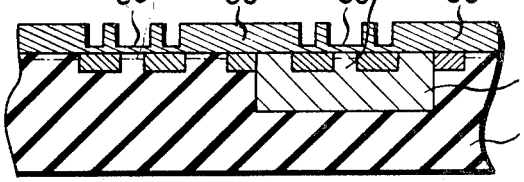
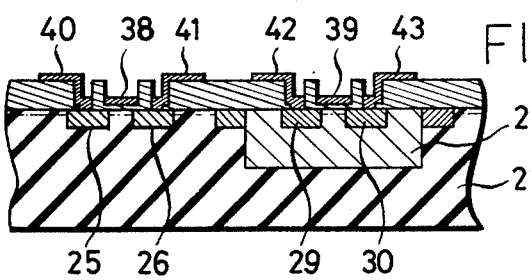

METHOD OF MANUFACTURING COMPLEMENTARY INSULATED GATE FIELD EFFECT SEMICONDUCTOR DEVICE BY MULTIPLE IMPLANTATIONS AND DIFFUSION

This is a divisional of application Ser. No. 828,852 filed: Aug. 29, 1977, now abandoned.

BACKGROUND OF THE INVENTION

1. Field of the Invention

The present invention relates to a complementary insulated gate field effect semiconductor device and a method of manufacturing the same. More specifically the present invention relates to an improved complementary insulated gate field effect semiconductor device and a method for manufacturing the same employing ion implantation.

2. Description of the Prior Art

A process for manufacturing an example of a conventional complementary insulated gate field effect semiconductor device is shown in FIGS. 1a to 1e which illustrate sectional views of the semiconductor device at various stages of the manufacturing process.

Referring first to FIG. 1(a), a semiconductor substrate 1 of an N conductivity type is formed, partially in the vicinity of the surface, of a well 2 of a P conductivity type by means of a well known ion implantation process. Referring to FIG. 1(b), then a source and drain regions 3 and 4 of a P+ conductivity type are formed at the original substrate area in the vicinity of the surface by means of a well known selective diffusion process, thereby to provide a first insulated gate field effect transistor comprising the source and drain regions 3 and 4. Again referring to FIG. 1(b), a guard region 5 of a P+ conductivity type surrounding the well region 2 and another guard region 6 of a P+ conductivity type surrounding a second insulated gate field effect transistor to be formed within the well 2 to be described below are also formed at the same time.

Referring to FIG. 1(c), a source and drain regions 7 and 8 of an N+ conductivity type are formed in the well 2 in the vicinity of the surface to form the second insulated gate field effect transistor. Referring to FIG. 1(c), a further guard region 9 of an N+ conductivity type is also formed at the same time surrounding the first insulated gate field effect transistor. Referring to FIG. 1(d), a thick oxide film 10 is then formed on the surface of the original semiconductor substrate 1 and on the well region 2, while thin gate oxide films 11 and 12 are formed on the channel regions of the first and second insulated gate field effect transistors. Referring finally to FIG. 1(e), source and drain electrodes 13, 14, 15 and 16 are provided in ohmic contact with the source and drain regions of the first and second insulated gate field effect transistors and gate electrodes 17 and 18 are also provided on the gate oxide films 11 and 12.

According to the above described conventional method for manufacturing a complementary insulated gate field effect semiconductor device, the threshold voltages of the respective insulated gate field effect transistors are determined as a function of the impurity concentrations in the original semiconductor substrate 1 and the well region 2, the thickness of the gate oxide film and the surface state density. Therefore, it is extremely difficult to make certain that threshold voltages of both insulated gate field effect transistors are the same.

The conventional complementary insulated gate field effect semiconductor device as described above also employs guard regions 6 and 9 surrounding the respective insulated gate field effect transistors for the purpose of preventing a parasitic MOS action occurring in the same region between the insulated gate field effect transistors. However, employment of such guard regions 6 and 9 degrades the degree of integration of an integrated circuit. Nevertheless, omission of these guard regions 6 and 9 could cause a parasitic MOS action. With a view to increasing the degree of integration of any integrated circuit, one could think of overlapping, in part, the guard regions 5, 6 and 9 and the source or drain regions in both of the above described insulated gate field effect transistors. However, partial overlapping of these guard regions 5, 6 and 9 causes the formation of a high concentration junction, which decreases the breakdown voltage between the respective insulated gate field effect transistors to about 6 volts. On the other hand, an attempt to separate the above described guard regions 5 and 9 with a view to increasing the breakdown voltage decreases the degree of integration of an integrated circuit.

SUMMARY OF THE INVENTION

According to the present invention, first a semiconductor substrate of one conductivity type is formed partially of a well region of an opposite conductivity type by means of a well known ion implantation process. The semiconductor substrate is then subjected to selective diffusion to form source and drain regions of the opposite conductivity type on the surface region of the substrate, whereby a first insulated gate field effect transistor is formed. The semiconductor substrate is further subjected to selective diffusion to form source and drain regions of one conductivity type and the well in the surface region, whereby a second insulated gate field effect transistor is formed. The device is then subjected to ion implantation such that an impurity of one conductivity type is simultaneously ion implanted in the substrate surface surrounding at least the first insulated gate field effect transistor and the channel region of the second insulated gate field effect transistor.

Preferably the device is then subjected to formation of an insulation film such that a thick insulation film is formed on the surface of the substrate and the well, while a thin gate insulation film is formed on the channel regions of the first and second insulated gate field effect transistors. Then the device is further subjected to an ion implantation process such that an impurity of the opposite conductivity type is ion implanted in the channel regions of the first and second insulated gate field effect transistors through the thin gate insulation films.

According to the present invention, the first two ion implantation processes enable the control of the substrate impurity concentrations, the enhancement of the field inversion voltages of the complementary insulated gate field effect transistors and the threshold voltages of the complementary insulated gate field effect transistors made be made to be uniform. More specifically, the field inversion voltage of the second insulated gate field effect transistor is ensured by the first ion implantation process, while the field inversion voltage of the first insulated gate field effect transistor is ensured by the second ion implantation process. If the device is subjected to the third ion implantation process, the threshold voltage of the first insulated gate field effect transistor is controlled by the third ion implantation process while the threshold voltage of the second insulated gate field effect transistor is controlled in the form of counter doping by the second ion implantation process with respect to the first and third ion implantation processes. Thus, according to the preferred embodiment of the present invention, the field inversion voltages and the threshold voltages of the respective insulated gate field effect transistors are controlled with certainty by the above described three ion implantation processes. As a result, the breakdown voltage and the threshold voltages of the complementary insulated gate field effect transistors can be set easily as desired. This eliminates the necessity of the guard region for each of two insulated gate field effect transistors.

According to the present invention, the guard layer of a low concentration is employed by means of an ion implantation process. As a result, the scale of integration is enhanced and at the same time the breakdown voltage of the device is improved. In addition, the substrate impurity concentration of the guard layer formed by ion implantation can be controlled as desired by means of the ion implantation process. Since a desired breakdown voltage can be obtained by controling the substrate impurity concentration of the guard layer, even if the oxide film of the field area is made thin, the photoetching precision can be enhanced and the scale of integration can be improved by making the oxide film of the field area thiner.

Therefore, a principal object of the present invention is to provide an improved complementary insulated gate field effect semiconductor device and a method of manufacturing the same.

Another object of the present invention is to provide an improved complementary insulated gate field effect semiconductor device having a unified characteristic and a method for manufacturing the same.

A further object of the present invention is to provide an improved complementary insulated gate field effect semiconductor device having a higher breakdown voltage and a method for manufacturing the same.

Still a further object of the present invention is to provide an improved complementary insulated gate field effect semiconductor device of a uniform characteristics and a higher breakdown voltage manufactured employing ion implantation.

Still another object of the present invention is to provide a method for manufacturing an improved complementary insulated gate field effect semiconductor device by means of a smaller number of ion implantation processes.

Still a further object of the present invention is to provide an improved complementary insulated gate field effect semiconductor device wherein a parasitic MOS action is unlikely to occur while the scale of integration is enhanced and to provide a method for manufacturing the same.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows sectional views of the semiconductor substrate of the insulated gate field effect semiconductor device of the present invention at several stages of its manufacturing process.

DESCRIPTION OF THE PREFERRED EMBODIMENTS

Figure 1A:
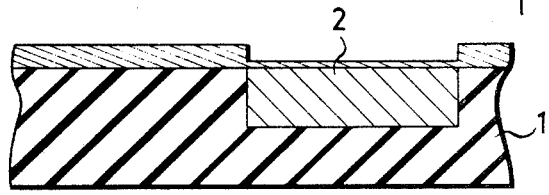
FIGS. 1(a) to 1(e) show sectional views of a semiconductor substrate of a conventional insulated gate field effect semiconductor device at several stages of its manufacturing process.
Figure 1B:
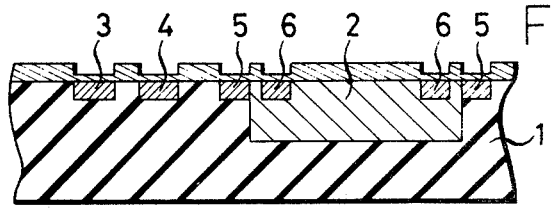
Figure 1C:
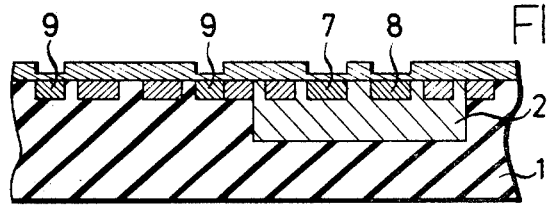
Figure 1D:
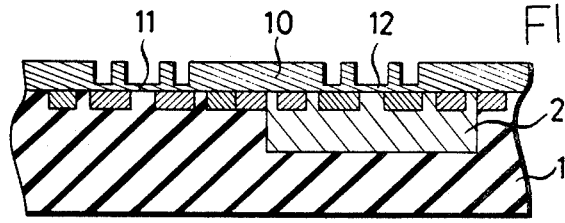
Figure 1E:
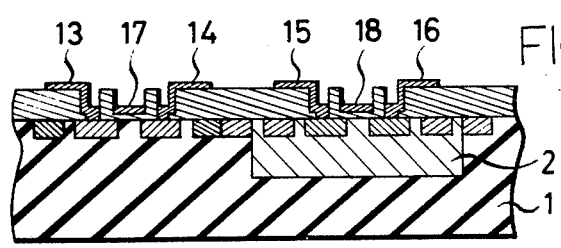

Referring to FIGS. 2(a) to 2(f) the present invention will now be described.

Step No. 1

According to FIG. 2(a), the first step comprises the formation of a P type well region 22 at a portion of the main surface of an N type semiconductor substrate 21 by means of ion implantation of a P type impurity. Ions are first implanted to a depth of less than $1\mu$ and then to a depth of 8 to $9\mu$. The semiconductor substrate 21 may be an N type silicon substrate. A portion of the main surface of the substrate is converted in its the conductivity type into a P type to form the P type well 22 by means of ion implantation.

Generally, the impurity concentrations at the N type substrate 21 and the P type well 22 are selected in consideration of the breakdown voltage and the junction capacitance of the source and drain junctions between the source and drain regions to be formed in the N type substrate and the P type well in the subsequent step and the bulk region surrounding the source and drain regions. More specifically, if by way of an example the depths of these junctions are to be set to $2\mu$ as required by formation of the P-N junction and the junction breakdown voltage is to be higher than 15 volts, then the substrate impurity concentrations in both the original substrate 21 and the wall 22 must be smaller than $6\times10^{16}$ cm$^{-3}$.

For the purpose of formation of the P type well 22, the semiconductor substrate 21 is first subjected to thermal oxidization of the surface to form a thick silicon dioxide film 23 as thick as about 7000 Å and is then subjected to a photoetching process to partially remove the thick oxide film 23 above an area where the well 22 is to be formed. Then the semiconductor substrate 21 is further subjected to thermal oxidization of the surface such that the surface of the substrate 21 where the well 22 is to be formed may be formed of a thin silicon dioxide film 24 as thick as about 1000 A. In such a situation the semiconductor substrate is then subjected to ion implantation of a P type impurity such as boron, whereby the well region 22 of the P conductivity type is formed by virtue of the oxide film thickness. The substrate impurity concentration of the well region 22 should be selected in consideration of the field inversion voltage of the second insulated gate field effect transistor to be formed in the well region 22 to be described below such that a parasitic MOS action may not occur.

Generally speaking, the field inversion voltage VT that could cause a parasitic MOS action is determined by the field oxide film thickness Tox, the surface state density Qss/q and the substrate impurity concentration NB. As a matter of practice, the field oxide film thickness Tox is restricted due to manufacturing factors and the surface state density Qss/q has a close relation with the threshold voltage of the insulated gate field effect transistor. Therefore, it is most preferred to control the substrate impurity concentration NB at the P type well region 22 by means of ion implantation. By way of an example, assuming that the field oxide film thickness Tox is $1.0\mu$ and the surface state density Qss/q is $1 \times 10^{10}$ cm$^{-2}$ to $1 \times 10^{11}$ cm$^{-2}$, then in order to make the field inversion voltage VT be higher than 15 volts, the substrate impurity concentration NB of the N type substrate must be larger than $9.2 \times 10^{15}$ cm$^{-3}$ and the substrate impurity concentration NB of the P type substrate must be larger than $1.9 \times 10^{16}$ cm$^{-3}$.

In consideration of the foregoing discussion, the substrate impurity concentration NB of the P type well region 22 to be formed the present step is selected in with regard to the threshold voltage to be adopted for the insulated gate field effect transistor to be formed therein, the field inversion voltage VT and the breakdown voltage of the source and drain regions to be formed therein. As the matter of practice, therefore, the substrate impurity concentration NB in the P type well region 22 is selected to be within the range of from $1.9 \times 10^{16}$ cm$^{-3}$ to $6 \times 10^{16}$ cm$^{-3}$ and, as to be described below, the substrate impurity concentration NB is selected to be a value in the range determinable by a second ion implantation process.

Step No. 2

Referring to FIG. 2(b), the second step of the present process comprises selective diffusion of source and drain regions 25 and 26 in the surface of the original semiconductor substrate 21 to form a first P channel insulated gate field effect transistor. This step will be described in more detail in the following. In the second step, the semiconductor substrate is subjected to a photoetching process such that the oxide film 27 formed on the surface of the semiconductor substrate 21 is removed partially to provide openings at areas where desired source and drain regions 25 and 26 are to be formed and the semiconductor substrate is then subjected to diffusion of a P type impurity such as boron or the like, whereby the P+ type source and drain regions 25 and 26 are formed. A film formed within the well region 22 during an impurity ion implantation in Step No. 1 can be advantageously utilized as the above described oxide film 27. If it is necessary in consideration of the field inversion voltage of the insulated gate field effect transistors, a guard region 28 of a P+ conductivity type surrounding the well region 22, may be simultaneously formed through diffusion of the impurity.

Step No. 3

Referring to FIG. 2(c), the third step of the present process comprises diffusion of source and drain regions 29 and 30 of an N+ conductivity type in the surface of the well region 22, thereby to form a second N channel insulated gate field effect transistor in the well region 22. This step can be effected in substantially the same manner as described in conjunction with the second step of the conventional process. Typically, phosphide (POcl3) is utilized as a source of an N type impurity.

Step No. 4

This step constitutes an essential feature of the present invention. Referring to FIG. 2(d), the fourth step comprises simultaneous ion implantation of an N type impurity into both the field surface of the original substrate 21 surrounding the first insulated gate field effect transistor and the channel region 31 of the second insulated gate field effect transistor formed in the well region 22. Referring to FIG. 2(d), the ion implanted layer has been shown by dotted line 34. This ion implantation process can be effected in substantially the same manner as described in conjunction with the first step. However, the areas where the present ion implantation should not be effected, i.e. the area of the first insulated gate field effect transistor region and the channel regions of the second insulated gate field effect transistor are covered with a thick oxide film 32. The area where ions should be implanted, i.e. the surface of the substrate 21 excluding the first insulated gate field effect transistor region and the channel region 31 of the second insulated gate field effect transistor, are covered with a thin oxide film 33. Then, the semiconductor device is subjected to ion implantation by the use of an impurity source providing an N type impurity such as phosphorous.

A primary object of the present step is to secure the field inversion voltage VT required for the substrate 21 where the first insulated gate field effect transistor is formed. As previously described in conjunction with the first step, in order to make the field inversion voltage VT be higher than 15 volts, the N type substrate impurity concentration NB must be larger than $9.2 \times 10^{15}$ cm$^{-3}$, and in order to make the breakdown voltage of the source and drain junctions higher than 15 volts, the substrate impurity concentration NB must be smaller than $6 \times 10^{16}$ cm$^{-3}$. Thus, the substrate impurity concentration NB must be selected to meet this concentration range. A secondary object of the present ion implantation step is to set the threshold voltage of the second insulated gate field effect transistor. Generally, the threshold voltage VT of the insulated gate field effect transistor is determined by the thickness of the gate oxide film Tox, the surface state density Qss/q and the substrate impurity concentration NB, as described above. Assuming in the present embodiments that the thickness of the gate oxide film Tox is 700 through 800 Å, and the surface state density Qss/q is set to the range expressed by the following inequality, $$1 \times 10^{10} \text{ cm}^{-2} \leq Qss/q \leq 1 \times 10^{11} \text{ cm}^{-2}$$

then, in order to control the threshold voltage of the second insulated gate field effect transistor to about 1.0 volts, the surface impurity concentration NB of the channel region of the second insulated gate field effect transistor is preferably selected to be a value in the range of $0.98 \times 10^{16}$ cm$^{-3}$ to $1.6 \times 10^{16}$ cm$^{-3}$ to obtain a good result. Accordingly, the amount of ion implantation in the present ion implantation step is selected within the allowable range determinable by the surface impurity concentration NW of the well region 22 formed by the above described first step, the surface impurity concentration NA of the guard layer 34 of the field area in the substrate 21 surrounding the first insulated gate field effect transistor formed in the present step, and the surface impurity concentration NN of the channel region of the second N channel insulated gate field effect transistor as controlled by the present step.

Now for confirmation, the respective allowable ranges of the above described three factors are described again in the following. The surface impurity concentration NW of the P type well region 22 may be expressed as follows as is clear from the description in conjunction with the first step.

$$1.9 \times 10^{16} \text{ cm}^{-3} \leq NW \leq 6 \times 10^{16} \text{ cm}^{-3}$$

The surface impurity concentration NA of the guard layer 34 of the field area associated with the first insulated gate field effect transistor formed in the substrate 21 in the present step may be expressed as follows similarly as is clear from the description of the first step.

$$9.2 \times 10^{15} \text{ cm}^{-3} \leq NA \leq 6 \times 10^{16} \text{ cm}^{-3}$$

Finally the surface impurity concentration NN of the channel region of the second insulated gate field effect transistor may be expressed as follows as is clear from the description of the present step.

$$0.98 \times 10^{16} \text{cm}^{-3} \leq NN \approx NW - NA \leq 1.6 \times 10^{16} \text{cm}^{-3}$$

It is pointed out that since the initial surface impurity concentration before the guard layer 34 of the concentration NA is formed is much smaller than the concentrations NA and NW such initial concentration may be disregarded in considering the last described mathematical expression and hence the concentration NN may be deemed as nearly equal to NW−NA.

In order to satisfy the above described inequalities, the concentrations NA and NW must be in the following ranges.

$$1.0 \times 10^{16} \text{ cm}^{-3} \leq NA \leq 1.22 \times 10^{16} \text{ cm}^{-3}$$

$$2.2 \times 10^{16} \text{ cm}^{-3} \leq NW \leq 2.6 \times 10^{16} \text{ cm}^{-3}$$

Thus, it has been found that the first ion implantation process for formation of the well region 22 by the above described first step and the second ion implantation process of the present step must be controlled to satisfy these two inequalities in conjunction with the surface impurity concentrations NA and NW. Thus, it will be appreciated that the first and second ion implantation processes selected to satisfy the above described ranges of the surface impurity concentrations NA and NW make the field inversion voltage of the second insulated gate field effect transistor formed in the well region 22 and the field inversion voltage of the first insulated gate field effect transistor formed in the substrate 21 larger than the above described preselected voltage of 15 volts, thereby bringing about a desired threshold voltage of the second insulated gate field effect transistor by virtue of counter doping by the present step in the channel region of the second insulated gate field effect transistor.

The guard layer 34 formed in the field area of the first insulated gate field effect transistor by ion implantation is adapted to be formed in the area of the substrate surface only excluding the first insulated gate field effect transistor region and the well region. This serves to ensure the field inversion voltage of the field area of the first insulated gate field effect transistor through the entire area of the guard layer 34 irrespective of the electrode pattern to be formed subsequently, with the result that one is free in designing the electrode pattern as desired.

Step No. 5

Referring to FIG. 2(e), the fifth step comprises the formation of a thick insulation film 35 above the first and second insulated gate field effect transistors and formation of a thin gate insulation film 36 above the channel regions of the first and second insulated gate field effect transistors. The thick insulation film 35 and the thin gate insulation film 36 formed in the present step serve as a protection film of the present complementary insulated gate field effect semiconductor device ultimately.

For the purpose of the present step, the oxide film used in the previous second ion implantation process is entirely removed and a thick insulation film 35 is newly formed on the surface of the N type substrate region 21 and and P type well region 22. The thick insulation film 35 may be formed by first forming a thin silicon dioxide film to a thickness of about 700 Å through thermal oxidization and by further depositing thereon a silicon dioxide film of about 1.0μ thickness through pyrolysis of silane. Then the thick insulating film 35 is subjected to a photoetching process such that the portions of the thick insulation film 35 above the channel regions and source and drain regions of the first and second insulated gate field effect transistors are removed. Then a thin gate insulation film 36 of about 700 Å thick is formed on the channel and source and drain regions by thermal oxidization. The thick and thin insulation films 35 and 36 formed in the present step may comprise only a silicon dioxide film as described above. Alternatively, such insulation films 35 and 36 may comprise a composite layer structure of a silicon oxide film and a silicon nitride film.

Step No. 6

The sixth step comprises ion implantation of a P type impurity simultaneously to the channel regions 37 and 31 of the first and second insulated gate field effect transistors through the thin gate insulation film 36 formed in the fifth step. An object of the present step is to control the doping to the channel region 37 of the first insulated gate field effect transistor and thus the threshold voltage of the first insulated gate field effect transistor. As previously described in conjunction with the fourth step, the threshold voltage VT of the insulated gate field effect transistor is determined by the thickness Tox of the gate oxide film, the surface state density Qss/q and the substrate impurity concentration NB. In the above described embodiment, it was assumed that the thickness Tox of the gate oxide film is 700 through 800 Å, and the surface state density Qss/q is selected to be a value in the range expressed by the following inequality $$1 \times 10^{10} \text{ cm}^{-2} \leq Qss/q \leq 1 \times 10^{11} \text{ cm}^{-2}$$

In order to control the threshold voltage of the first insulated gate field effect transistor to about 1.0 volt, in such a situation, the surface impurity concentration NB of the channel region 37 of the first insulated gate field effect transistor must be smaller than $1 \times 10^{14}$ cm$^{-3}$. Accordingly, the present ion implantation process is carried out such that the surface of the channel region of the first insulated gate field effect transistor determining the threshold voltage VT thereof may be the surface impurity concentration NB within the above described range. It follows that the present ion implantation process is carried out also in the channel region of the second insulated gate field effect transistor. However, as described previously in conjunction with the fourth step, the channel region of the second insulated gate field effect transistor has been controlled to the value of the surface impurity concentration NN in the range defined by the following inequality.

$$9.8 \times 10^{15} \text{ cm}^{-3} \leq NN \leq 1.6 \times 10^{16} \text{ cm}^{-3}$$

Therefore, the surface impurity concentration attained by the present ion implantation process is extremely low as compared with the above described surface impurity concentration, with the result that the threshold voltage of the second insulated gate field effect transistor is hardly influenced by the present ion implantation process.

It is pointed out that if the concentration of the original substrate is selected to less than $1\times 10^{14}$ cm$^{-3}$, then the present third ion implantation process can be dispensed with.

Final Step

Referring to FIG. 2(f), the final step comprises formation of electrodes. To that end, the present device is subjected to a photoetching process such that apertures are formed in the thin gate oxide film 36 above the source and drain regions 25, 26, 29 and 30 of the first and second insulated gate field effect transistors. Then an electrode material such as an aluminum is evaporated on the entire surface of the present device, which is then subjected to a further photoetching process such that gate electrodes 38 and 39 of the first and second insulated gate field effect transistors are formed on the gate oxide film 36, respectively, and source and drain electrodes 40, 41, 42 and 43 in ohmic contact through the above described aperture with the source and drain regions 25, 26, 29 and 30 of the first and second insulated gate field effect transistors, are formed.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for manufacturing a complementary insulated gate field effect semiconductor device, comprising the steps of preparing a semiconductor substrate of one conductivity type, doping an impurity of the opposite conductivity type in a portion of said semiconductor substrate by a first ion implantation process for forming a well region of the opposite conductivity type whereby the impurity concentration in said well region is sufficiently high for causing a withstand voltage of a PN junction formed in said well region to be larger than a driving voltage of said insulated gate field effect semiconductor device and for causing a field inversion voltage of said well region to be larger than said driving voltage, said well region constituting a field portion of said insulated field effect semiconductor device, diffusing an impurity of the opposite conductivity type in portions of said semiconductor substrate for forming source and drain regions of the opposite conductivity type spaced apart from each other with a channel region therebetween, whereby a first enhancement insulated gate field effect transistor is formed, diffusing an impurity of one conductivity type in portions of said well region for forming source and drain regions of one conductivity type spaced apart from each other with a channel region therebetween, whereby a second enhancement insulated gate field effect transistor is formed, and doping a further impurity of one conductivity type simultaneously by a second ion implantation process in the surface portion of said semiconductor substrate surrounding said first insulated gate field effect transistor and said channel region of said second insulated gate field effect transistor, whereby said further impurity concentration is selected such that the threshold potential of said second insulated gate field effect transistor is substantially equal to that of said first insulated gate field effect transistor in terms of the absolute value, and that the field inversion voltage of the field portion of said first insulated gate field effect transistor is larger than the driving voltage of said first insulated gate field effect transistor.

2. A method for manufacturing a complementary insulated gate field effect semiconductor device in accordance with claim 1, which further comprises the step of doping an impurity of the opposite conductivity type in at least the channel region of said first insulated gate field effect transistor by a third ion implantation process.

3. A method for manufacturing a complementary insulated gate field effect semiconductor device in accordance with claim 1, which further comprises the step of forming a thick insulation film on said semiconductor substrate and said well region and a thin gate insulation film on said channel regions of said first and second insulated gate field effect transistors, before said third ion implanation process.

4. The method for manufacturing a complementary insulated gate field effect semiconductor device in accordance with claim 1, wherein said first mentioned impurity concentration of said well region is selected in the range of $1.9\times 10^{16}$ cm$^{-3}$ to $6\times 10^{16}$ cm$^{-3}$.

5. The method for manufacturing a complementary gate field effect semiconductor device in accordance with claim 1, wherein said further impurity concentration of said field portion of said first insulated gate field effect transistor of said substrate is selected to be in the range of $9.2\times 10^{15}$ cm$^{-3}$ to $6\times 10^{16}$ cm$^{-3}$.

6. The method for manufacturing a complementary insulated gate field effect transistor device in accordance with claim 1, wherein said first mentioned impurity concentration of said well region is selected to be in the range of $2.2\times 10^{16}$ cm$^{-3}$ to $2.6\times 10^{16}$ cm$^{-3}$, and wherein said further impurity concentration of said field portion of said first insulated gate field effect transistor of said substrate is selected to be in the range of $1.0\times 10^{16}$ cm$^{-3}$ to $1.22\times 10^{16}$ cm$^{-3}$.

* * * * *